United States Patent
Hwang et al.

(10) Patent No.: US 9,431,389 B2
(45) Date of Patent: Aug. 30, 2016

(54) ESD TRANSISTOR FOR HIGH VOLTAGE AND ESD PROTECTION CIRCUIT THEREOF

(71) Applicant: MagnaChip Semiconductor, Ltd., Cheongju-si (KR)

(72) Inventors: Kyong Jin Hwang, Cheongju-si (KR); Jin Seop Shim, Cheongju-si (KR); Jae Hyun Lee, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 144 days.

(21) Appl. No.: 14/188,136

(22) Filed: Feb. 24, 2014

(65) Prior Publication Data

US 2014/0367783 A1    Dec. 18, 2014

(30) Foreign Application Priority Data

Jun. 12, 2013   (KR) .......................... 10-2013-0067339

(51) Int. Cl.
*H01L 27/02* (2006.01)
*H01L 29/732* (2006.01)
*H01L 29/08* (2006.01)

(52) U.S. Cl.
CPC ....... *H01L 27/0259* (2013.01); *H01L 29/0821* (2013.01); *H01L 29/732* (2013.01)

(58) Field of Classification Search
CPC .................... H01L 27/0257; H01L 27/0259
See application file for complete search history.

(56) References Cited

U.S. PATENT DOCUMENTS

| | | | | |
|---|---|---|---|---|
| 5,760,448 A * | 6/1998 | Maeda | ................ | H01L 27/0259 257/362 |
| 5,808,342 A * | 9/1998 | Chen | ................ | H01L 27/0262 257/173 |
| 5,850,095 A * | 12/1998 | Chen | ................ | H01L 27/0248 257/175 |
| 6,194,764 B1 * | 2/2001 | Gossner | ............. | H01L 27/0248 257/355 |
| 6,242,793 B1 * | 6/2001 | Colombo | ............. | H01L 29/735 257/556 |
| 6,455,902 B1 * | 9/2002 | Voldman | ............. | H01L 27/0251 257/354 |
| 6,624,481 B1 * | 9/2003 | Pendharkar | ............ | H01L 23/60 257/355 |
| 6,680,493 B1 * | 1/2004 | Wolf | ................... | H01L 27/0259 257/173 |
| 6,724,050 B2 * | 4/2004 | Salling | ................ | H01L 27/0259 257/361 |
| 6,844,597 B2 | 1/2005 | Baird et al. | | |
| 6,864,538 B2 * | 3/2005 | Mettler | ............... | H01L 27/0259 257/173 |
| 7,164,566 B2 * | 1/2007 | Xu | ...................... | H01L 29/7322 257/362 |
| 7,268,398 B1 * | 9/2007 | Vashchenko | ........ | H01L 27/0266 257/355 |
| 7,977,769 B2 * | 7/2011 | Chao | ................... | H01L 27/0259 257/330 |
| 2010/0171149 A1 * | 7/2010 | Denison | ............ | H01L 29/7436 257/173 |
| 2010/0244088 A1 * | 9/2010 | Whitfield | ............ | H01L 27/0259 257/106 |
| 2013/0075864 A1 * | 3/2013 | Otake | ................. | H01L 27/0259 257/577 |
| 2013/0075866 A1 * | 3/2013 | Otake | ................. | H01L 27/0259 257/577 |
| 2014/0353799 A1 * | 12/2014 | Hwang | ................ | H01L 29/732 257/577 |
| 2014/0367783 A1 * | 12/2014 | Hwang | ............... | H01L 27/0259 257/360 |

\* cited by examiner

Primary Examiner — Evan Pert (57) ABSTRACT

An ESD transistor and an ESD protection circuit thereof are provided. An ESD transistor includes a collector region disposed on a surface of a substrate, a sink region disposed vertically below the collector region, and a buried layer protruding horizontally further than the sink region under the sink region.

27 Claims, 7 Drawing Sheets

ESD TRANSISTOR FOR HIGH VOLTAGE AND ESD PROTECTION CIRCUIT THEREOF

CROSS-REFERENCE TO RELATED APPLICATION

This application claims the benefit under 35 USC 119(a) to Korean Patent Application No. 10-2013-0067339 filed on Jun. 12, 2013, in the Korean Intellectual Property Office, the entire disclosure of which is incorporated herein by reference for all purposes.

BACKGROUND

1. Field

The present description relates to an ESD transistor and an ESD protection circuit thereof, and to an ESD protection circuit for a high voltage device that can reduce clamping voltage and can shunt high-level ESD current by forming an extended current path in an ESD transistor for high voltage, and an ESD transistor that forms a long current path.

2. Description of Related Art

Electrostatic discharge (hereafter, referred to as "ESD") technologies are very important for reliability of most integrated circuits or core circuits. Circuit designers can protect a core circuit by implementing an ESD protection circuit with an I/O pad connected to a ground GND, using an ESD transistor connected with the core circuit in parallel.

Figure 1:
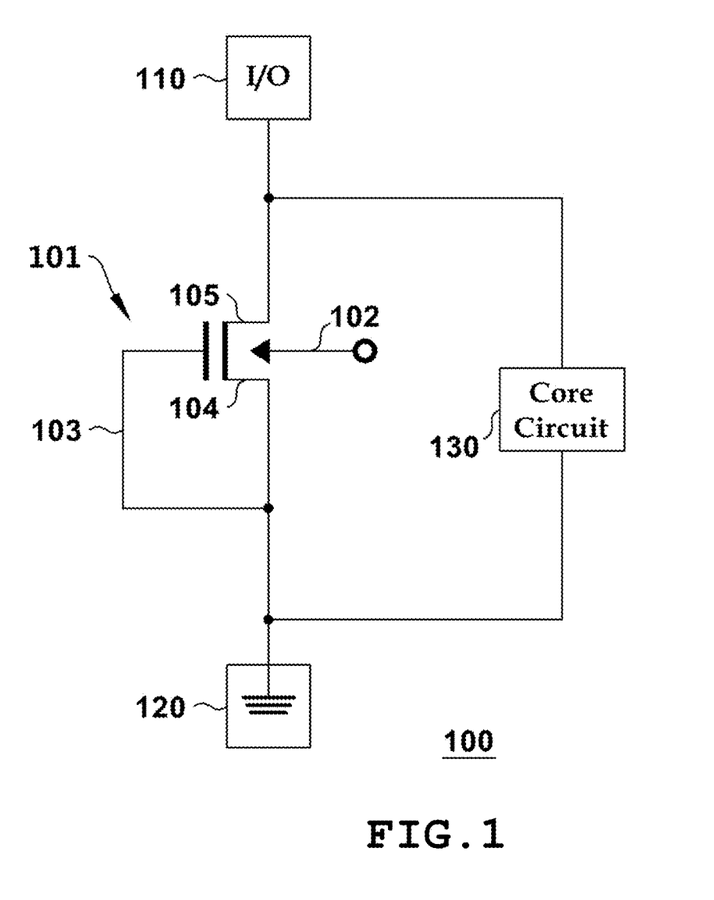
FIG. 1 is a block diagram illustrating an ESD protection circuit.

FIG. 1 is a block diagram illustrating an ESD protection circuit.

Referring to FIG. 1, an ESD protection circuit may be connected to an I/O pad 110 through its drain 105 and to a ground 120 through its source 104, in which a floating-body transistor 101 (or clamp) includes a body 102, a gate 103, the source 104, and the drain 105. The gate 103 is connected to the source 104 and a core circuit 130 is connected to the drain 105 and the source 104 in parallel with the floating-body transistor 101.

However, the ESD protection circuit with the illustrated configuration may exhibit difficulties in shunting high-level ESD currents while maintaining low clamping voltages. For example, in a transistor using high voltage over 20V, the doping concentration in the source 104 and the drain 105 should be low to maintain high break down voltage in the ESD protection circuit. During an event of electric discharge, the ability of the ESD protection circuit to protect the core circuit 130 decreases due to high turn-on voltage induced in the operation of a GGNMOS and a BJT. Even if the ESD protection circuit is turned on, strong snapback is caused by a kirk effect in high current bipolar operation mode. This, in turn, may cause the generation of interface current and a change of BJT turn-on voltage, because damage is frequently generated around a drift doping region and field oxide of an N+ doping boundary.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided an ESD transistor, the ESD transistor including: a collector region disposed on a surface of a substrate; a sink region disposed vertically below the collector region; and a buried layer protruding horizontally further than the sink region under the sink region.

The general aspect of the ESD transistor may further include: a base region on the surface of the substrate; a base contact region disposed in the base region; and an emitter region spaced apart from the base contact region in the base region.

At least two collector regions, base contact regions, sink regions, and buried layers may be respectively symmetrically disposed at both sides of the emitter region, and the two buried layers may protrude toward the emitter region.

The sink region may have an N-type dopant concentration in a range of $10^{19}$-$10^{21}$/cm$^3$.

The general aspect of the ESD transistor may further include a collector expansion region disposed under the collector region.

The general aspect of the ESD transistor may further include: a first insulating film disposed between the emitter region and the base contact region; and a second insulating film disposed between the base contact region and the collector region.

The base region may surround the emitter region and the base contact region.

The general aspect of the ESD transistor may further include at least one additional base region surrounding the base region.

The general aspect of the ESD transistor may further include a tap region spaced apart from the collector region by a third insulating film.

The general aspect of the ESD transistor may further include an additional well region under the tap region.

An ESD diode may be formed by another well region adjacent to the additional well region therebetween.

The general aspect of the ESD transistor may further include a resistor connected between an emitter electrode disposed at the upper portion of the emitter region and a base electrode disposed at the upper portion of the base contact region.

The ESD transistor may be a bipolar junction transistor.

The ESD transistor may be configured such that current that is applied to the collector region flows in a U-shaped path toward the emitter region through the base region after passing through the sink region and the buried layer.

In another general aspect, there is provided an ESD transistor, the ESD transistor including: a collector region on a surface of a substrate; a base region on the surface of the substrate; a base contact region disposed in the base region; an emitter region spaced apart from the base contact region in the base region; and a sink region disposed vertically below the collector region.

The ESD protection circuit may include an ESD transistor that includes a collector electrode, a base region, and an emitter electrode, and the collector electrode may be connected to an I/O pad; the emitter electrode may be connected to a ground electrode; a first resistor may b connected between the emitter electrode and the base electrode; a first diode may be connected between the emitter electrode and the collector electrode; and a charge pump circuit may include a high-voltage FET that is connected between the collector electrode and the base electrode.

The charge pump circuit may include a second diode disposed between a collector electrode and a base electrode of the high-voltage FET, and a second resistor may be disposed between a base and a ground of the high-voltage FET.

The first diode may be grounded at the portion combined with the emitter electrode.

The general aspect of the ESD transistor may further include a core circuit connected in parallel with the ESD transistor, and the first diode may be connected in parallel with the ESD transistor and the core circuit.

The first and second diodes may be connected in opposite directions to the collector electrode.

The ESD transistor may be a bipolar junction transistor.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof.

An ESD protection circuit may be connected to an I/O pad 110 through its drain 105 and to a ground 120 through its source 104 as illustrated in FIG. 1. However, many ESD protection circuits exhibit a difficulty in shunting high-level ESD currents while maintaining low clamping voltages.

Many efforts have been made to decrease triggering voltage in a high-voltage ESD device. Among these efforts, a method of reducing the triggering voltage by increasing well resistance of a GGNMOS was attempted, but such a method may cause a latch-up effect. Further, EDS protection devices (e.g. GnLDMOS) that are implemented by grounding the gate of the existing LDMOS devices exhibit very low efficiency. Most of them are inefficient devices with a stress current immunity level per length of less than 2 mA/μm. Further, the holding voltage of the existing LDMOS and EDMOS devices is low due to the high snapback voltage resulting from the kirk effect described above. The holding voltage of the ESD device is supposed to be higher than the operation voltage, but it is difficult to achieve a holding voltage higher than the operation voltage in high voltage applications using the existing LDMOS and EDMOS devices. Accordingly, high voltage application products basically require a very large area to form an ESD device using a high voltage diode, such that a large amount of cost is spent in manufacturing the chip.

The present disclosure relates to forming an ESD protection device and a circuit with high efficiency by forming an ESD protection BJT using a BCD process.

According to an aspect of the present disclosure, there is provided an ESD transistor for high voltage that can shunt high-level ESD current while reducing the clamping voltage by forming an extended current path in an ESD transistor for high voltage applications, and an ESD protection circuit thereof.

According to another aspect, there is provided an ESD transistor for high voltage applications that prevents deterioration of a diode while using the features of the diode by disposing a diode in parallel together with a resistor outside the ESD transistor, and an ESD protection circuit thereof.

According to another aspect, there is provided an ESD transistor for high voltage applications that allows faster control of a turn-on operation of the transistor by increasing the potential of a base of the ESD transistor in response to the inflow of stress current, by adding a charge pumping circuit at a side of the ESD transistor, and an ESD protection circuit thereof.

Figure 2:
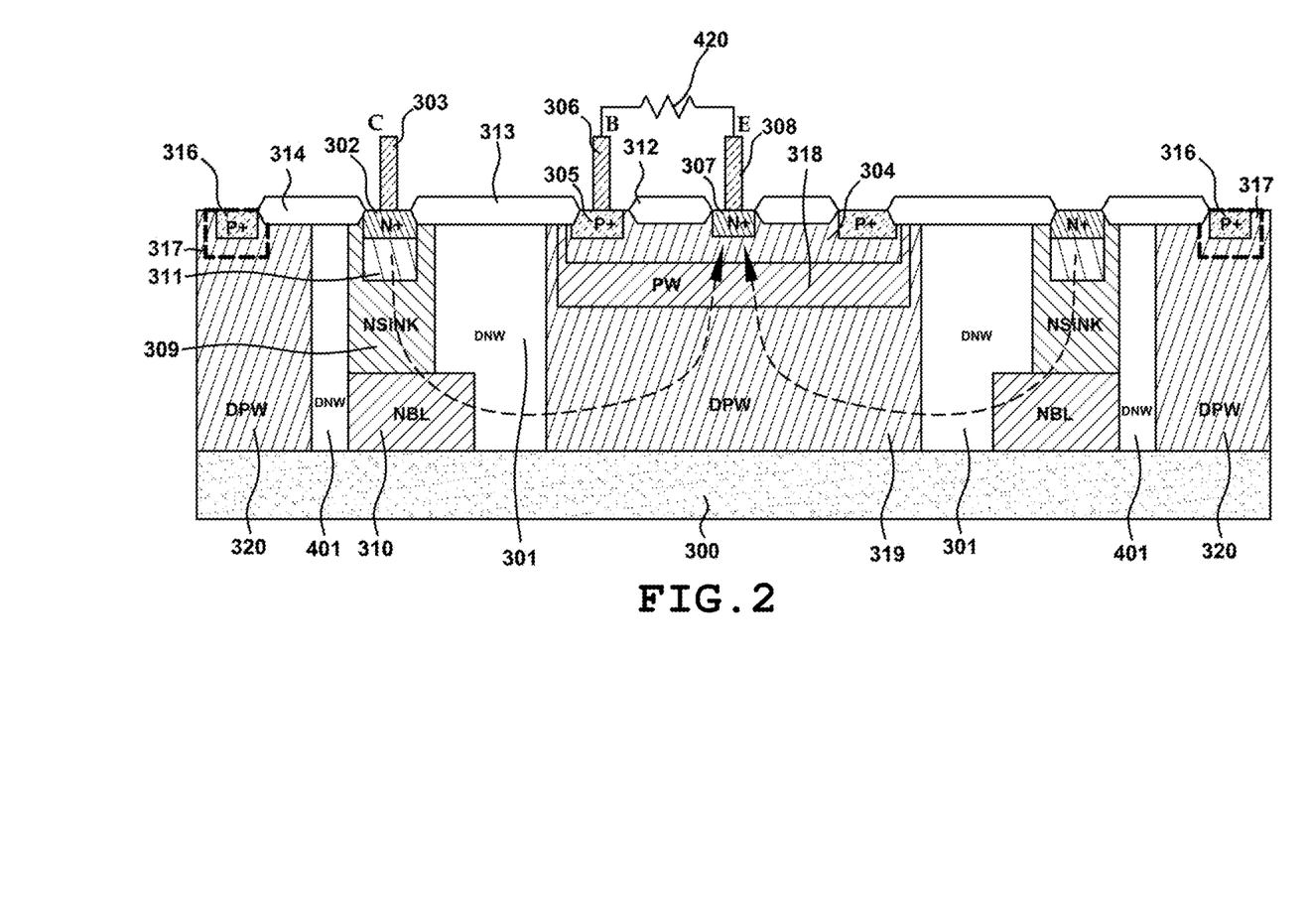
FIG. 2 is a cross-sectional view illustrating an example of an ESD transistor for high voltage.
Figure 3A:
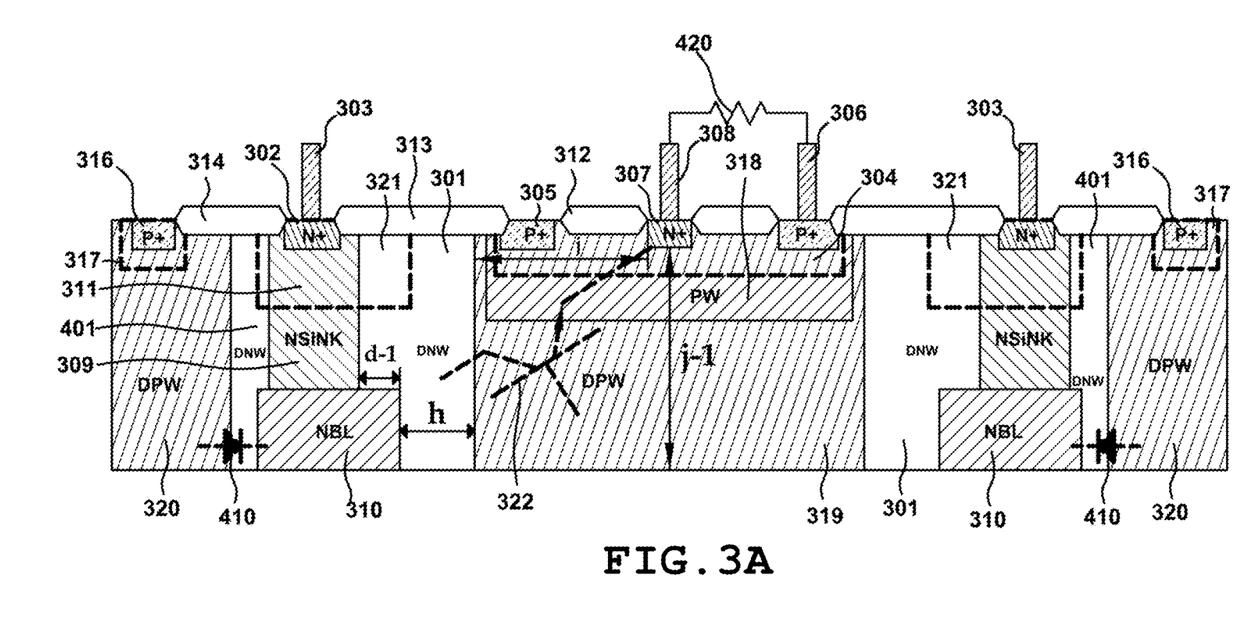
FIG. 3A is a cross-sectional view illustrating another example of an ESD transistor for high voltage.
Figure 3B:
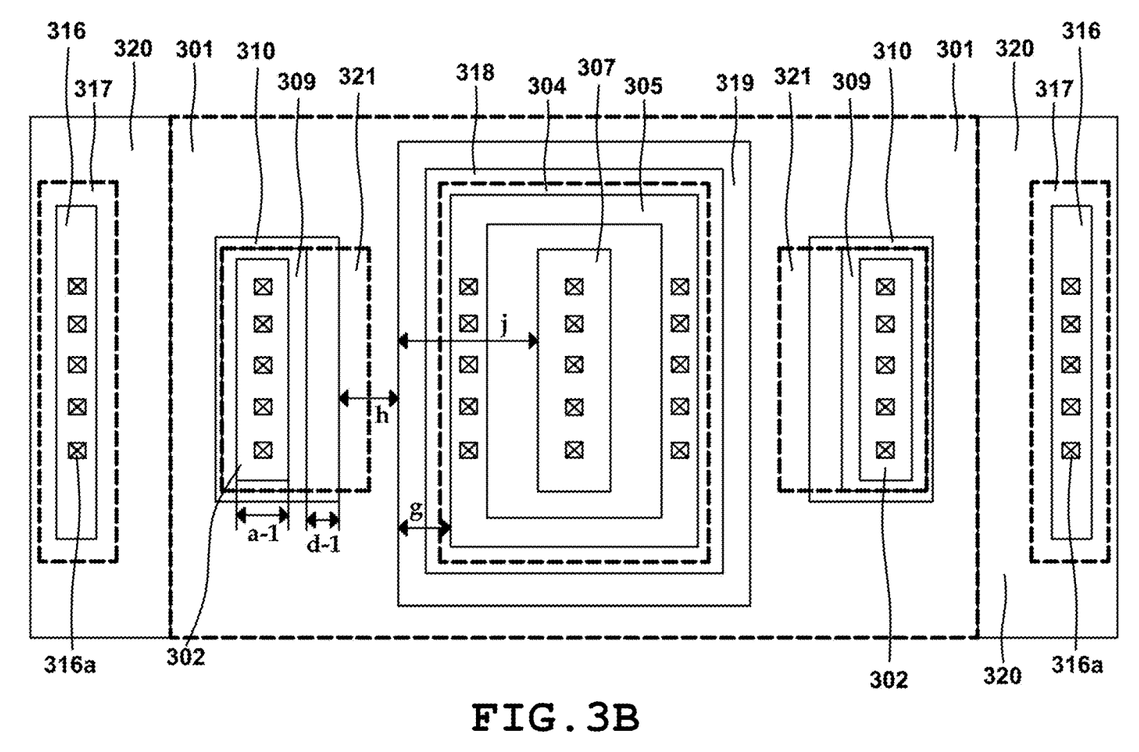
FIG. 3B is a plan view illustrating an example of the ESD transistor illustrated in FIG. 3A.
Figure 4:
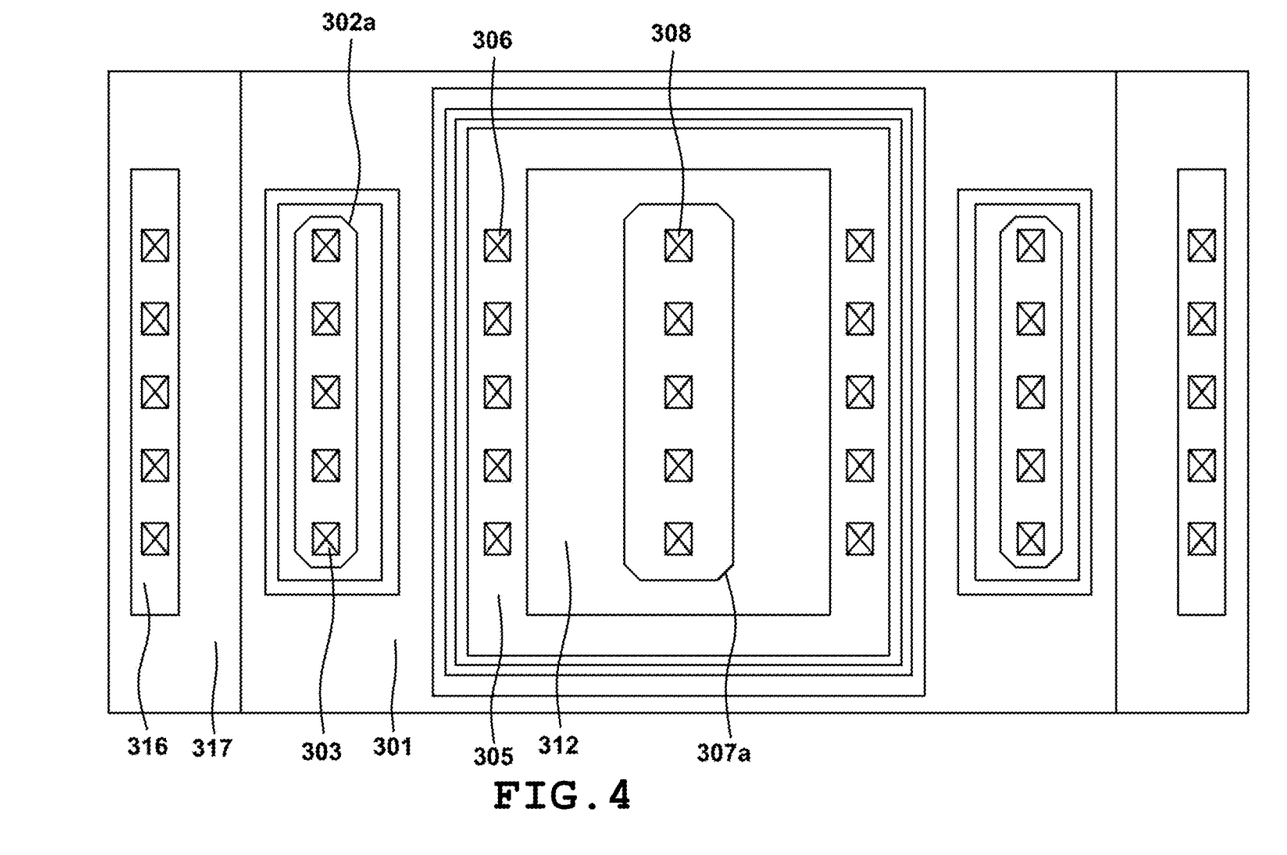
FIG. 4 is a plan view illustrating an example of the ESD transistor illustrated in FIG. 2.

FIG. 2 is a cross-sectional view illustrating an example of an ESD transistor for high voltage applications according to the present disclosure. FIG. 3A is a view illustrating another example of an ESD transistor. FIG. 3B is a plan view of the ESD transistor illustrated in FIG. 3A. FIG. 4 is a plan view illustrating another example of ESD transistor.

Referring to FIG. 2, an ESD transistor for high voltage according to an example includes a silicon substrate 300, N-wells region (DNW: Deep N-Well) 301 and 401 on the substrate 300, an N+ collector region 302 in the substrate, a P-base region 304 in the substrate, a P+ base contact region 305 in the base region 304, an N+ emitter region 307 spaced from the base contact region 305 in the base region 304, an N-sink region 309 formed vertically downward under the N+ collector region 302, and an N-buried layer 310 horizontally protruding further than the N-sink region 309 under the N-sink region 309.

The base region may further expand even to a P type dopant implanted DPW 319 and a PW 318. Accordingly, the entire base region may include the base region 304, the DPW 319, and the PW 318.

The collector region 302, the base contact region 305, the N-sink region 309, and the N-buried layer 310 are respectively symmetrically formed at both sides of the emitter region 307 and the N-buried layer 310 protrudes toward the emitter region 307. For example, the N-buried layer 310 protrudes toward the emitter region 307 such that the N-buried layer 310 is a predetermined distance apart from the DPW 319.

The N-sink region 309 is a region highly doped with an N-type dopant in an ion implantation process. The dopant concentration of the N+ collector 302, emitter region 307, N-sink region 309, and N-buried layer 310 is $10^{19}$-$10^{21}$/cm$^3$.

N-buried layer 310 and N-sink region 309 have different dopant concentrations to each other. N-buried layer 310 has higher dopant concentration than N-sink region 309.

For the configuration described above, the N-buried layer 310 and the collector region 302 are connected to the N-sink region 309 formed by the ion implantation process and then the emitter region 307 doped in N-type is formed in the base region 304 doped in P-type.

That is, as shown in FIG. 2, a BJT is formed by connecting the N-buried layer 310 and the collector region 302 with the N-sink region 309 (high doping by ion implantation and diffusion doping) and forming the emitter region 304 doped in N-type in the base region 304 doped in P-type.

The configuration causes the stress current to flow vertically to the collector/base/emitter, as illustrated in FIG. 2, such that the current path (see the dotted line in FIG. 2) expands over a wide area. Accordingly, thermal breakdown current and voltage increase in response to an inflow of stress. When the stress current path is laterally formed, the device can only cope with low stress current and voltage.

In other words, as illustrated in FIG. 2, the stress current applied to the collector region 302 flows in through a U-shaped path toward the emitter 307 through the base region 304 after passing through the vertically formed N-type sink region 309 and the horizontally protruding N-buried layer 310, such that a relatively long current path is maintained. Thus, it is possible to support high stress current and voltage without thermal breakdown (see the dotted line in FIG. 2).

An important factor in design of the N-buried layer 310 is the vertical depth j−1 of the entire base region (P-base 304, PW 318, and DPW 319) between the substrate 300 and the emitter region 307. The vertical depth should be at least 1.2 times or more of the width j of the entire base region (304, 318, and 319) to the end of the emitter region 307 and the additional base region (DPW) 319, so the U-shape current path can be obtained. If it is not in the opposite case and the holding voltage is lower than the operation voltage of the product at the time of operation of the ESD BJT to a stress pulse, the N-buried layer 310 under the base may not be formed. Since the stress current is discharged to the lowest impedance path, when the N-buried layer 310 is under the emitter/base and the vertical base region 304 is short, low holding voltage can be provided.

It may be possible to increase the holding voltage of the ESD BJT by increasing the P-type concentration of the base region 304 by adding a doping process that is used for forming another device such as a PW or PBODY on DPW ion implantation in the base region 304 in order to increase holding voltage. The dopant concentration of the DPW region is $10^{15}$-$10^{17}$/cm$^3$ and the PW 318 has a concentration of $10^{17}$-$10^{19}$/cm$^3$ higher than that of the DPW. The base region also has a concentration of $10^{17}$-$10^{19}$/cm$^3$, similar to the PW concentration. The base contact region 305 has a concentration $10^{19}$-$10^{21}$/cm$^3$ higher than that of the base region. The PW region 318 can be formed together when a PW of a logic device inserted in a core or a surrounding circuit is formed. The base region can be formed together when the base region is formed in the BJT device. Since both can be formed in one process, as described above, there is no additional processing cost.

In FIGS. 3A and 3B, the j is about 4~6 μm for high-voltage device having operation voltage of 50V, the distance h between the N-buried layer 310 and the DPW 319 is about 2~5 μm, and the distance d−1 of the protruding portion of the N-buried layer 310 is about 1~4 μm. Those values depend on the doping level in the doping process and determine the breakdown voltage, so the design can be adjusted in a predetermined process. The base region (304, 318, 319) of the ESD BJT is formed deep, with a depth j−1 of 7~22 μm.

The N-buried layer 310 is formed as to protrude into the deep N-well (DNW) 401 by a distance d−1 in the example to secure sufficient DPW region. It is possible to increase the holding voltage $V_h$ by sufficiently securing the DPW width. The holding voltage may be set to be higher than the operation voltage $V_{op}$ of the core circuit, so the high-voltage core circuit can be protected. For example, when there is a high-voltage device operating at 50V in a core circuit, and the holding voltage is 60V, a voltage 10% higher than the operating voltage may be used, but the holding voltage depends on the horizontal distance of the DPW region. Accordingly, the larger the DPW width, the higher the holding voltage is. Therefore, the DPW width can be increased when the N-buried layer is spaced apart from the DPW region, rather than being adjacent to it, so the region of the N-buried layer is spaced from the DPW so as not to be adjacent.

The N-well regions 301 and 401 disposed around the collector region 302 should be doped low so that the collector region 302 and the base region 304 or the collector region 302 and the substrate 300 do not have low breakdown voltage. It is a well for insulation of a logic process or for forming a high-voltage device.

Further, it is possible to adjust to desired voltage by adding an NW region 321 in the collector region 302, if necessary. As the doping of the region is enhanced by the NW region 321, the connection breakdown voltage is slightly decreased, such that turn-on of the ESD BJT can be induced more quickly in response to an inflow of ESD stress. For example, referring to the curve at the right side in FIG. 6, according to that curve, the ESD device is turned on in response to a stress current in a range of 70-80V. Such turn-on voltage value may be too large for many applications. Because the operation of the ESD device is slow, damages may be caused to the inner circuit being protected. Accordingly, it is desirable for the ESD device to be turned on as soon as possible, such that the NW region 321 is additionally formed by ion implantation. The dopant concentration of the NW region 321 is $10^{18}$-$10^{19}$/cm$^3$. Accordingly, the N-sink region 309 has at least two areas with different concentrations. It is divided into an upper region overlapping the NW region and a lower region not overlapping the NW region.

Because the thermal breakdown current and voltage are increased in inflow of stress current by the long current path formed in the ESD transistor for high voltage over 20V, it is possible to reduce the clamping voltage and shunt the high-level ESD current.

The collector region 302, the sink region 309, and the buried layer 310 are doped with an N-type doping substance.

The ESD transistor for high-voltage further includes a first insulating film 312 formed between the emitter region 307 and the base contact region 305 and a second insulating layer 313 formed between the base contact region 305 and the collector region 302.

The second insulating film 313 is formed to be sufficiently wide, as illustrated in FIG. 2. This is because when stress current flows to the collector region 302 and a current path between the base contact region 305 and the collector region 302 is formed on the surface under the second insulting film 313, thermal breakdown may be generated faster.

Accordingly, early breakdown voltage may be generated with stability by making the horizontal length of the second insulating film 313 larger than the vertical depth J−1 between the substrate 300 and the emitter region 307. Accordingly, a lateral current path is not formed on the surface under the second insulator film 313 in inflow of ESD stress, such that early breakdown voltage can be stably generated.

The base region 304 surrounds the emitter region 307 and the base contact region 305. The base region 304 may further include one or more additional base regions 318 and 319 surrounding the base region 304.

The additional base regions 318 and 319 may be formed in a PW (P-Well) or a DPW (Deep P-Well), respectively. As a wide base region is secured by using the DPW and the PW, high holding voltage Vh>Vop can be achieved for the ESD BJT. Further, this is for appropriately adjusting the breakdown voltage between the additional base regions 318 and 319 and the adjacent well region 301. The breakdown voltage between the additional base region 318 and the well region 301 depends on the concentration of the P-well and desired breakdown voltage can be obtained by appropriate ion implantation concentration in forming of the P-well, such that the degree of freedom for the device performance can be increased (see a virtual BJT transistor 322 shown in FIG. 3A).

Further, a tap region 316 that is spaced from the collector region 302 by a third insulating film 314 and highly doped in P-type is further included and additional well regions 317 and 320 may be further included under the tap region 316. The additional well regions 317 and 320 may be a P-well (PW, 317) and a deep P-well (DPW, 320). The tap region 316 is provided for applying ground voltage or negative voltage to the substrate 300. Further, an ESD diode is implemented between the deep P-well (DPW) 320 and the adjacent deep N-well (DNW) 401 (see the shape of the virtual diode 410 shown in FIG. 3A). The dopant concentration is the DNW is $10^{15}$-$10^{17}$/cm$^3$, lower than the dopant concentrations of the N-sink region, the collector region, the emitter region, and the N-buried layer around it.

In this example, the first to third insulating films 312, 313, and 314 are formed by a LOCOS process; however, in other examples, the insulating films 312, 313, and 314 may be formed by a STI (Shallow Trench Isolation) process.

The reference numeral "321" indicates an NW region additionally surrounding the collector region 302.

The ESD transistor for high voltage according to this example may be a BJT (Bipolar Junction Transistor).

Further, referring to FIG. 3B, which is a plan view of an example of the ESD protection device, the emitter region 307 is positioned at the center, and the collector region 302, the base contact region 305, the N-sink region 309, and the N-buried layer 310 are respectively symmetrically formed at both sides of the emitter region 307. The N-buried layer 310 protrudes toward the emitter region.

It should be noted in manufacturing the structure of the EDS protection device that the area of the active region of the collector region 302, which is indicated by "a−1", should be sufficiently large such that current crowding is not generated. This is for preventing current crowding in a narrow region, when stress flows into the collector region 302 of the BJT.

Further, as illustrated in FIG. 4, in an example of the ESD transistor for high voltage, the collector region 302a and the emitter region 307a each may be formed in an octagonal shape with a horizontal cross-sectional having corners.

Accordingly, as the horizontal cross-sections of the collector region 302a and the emitter region 307a have corners. For silicon material, the corners may be formed substantially an ellipse shape or a curved shape, so that there may be no pointed corner. By forming round corners, it is possible to prevent failure at a low level due to concentration of an electric field at the angled corners of the structure.

That is, as illustrated in FIG. 4, the active edges of the collector and the emitter are formed partially at 45 degrees such that the structure is rounded in the actual process to prevent concentration of an electric field at the corners. In some cases, the active edge may be formed at a right angle, as shown in FIG. 3B.

The metal connecting the collector and emitter electrodes is formed large over 120% of the active area for patterning. Accordingly, a melting point may be generated at a narrow metal line by the high ESD stress current.

Figure 5:
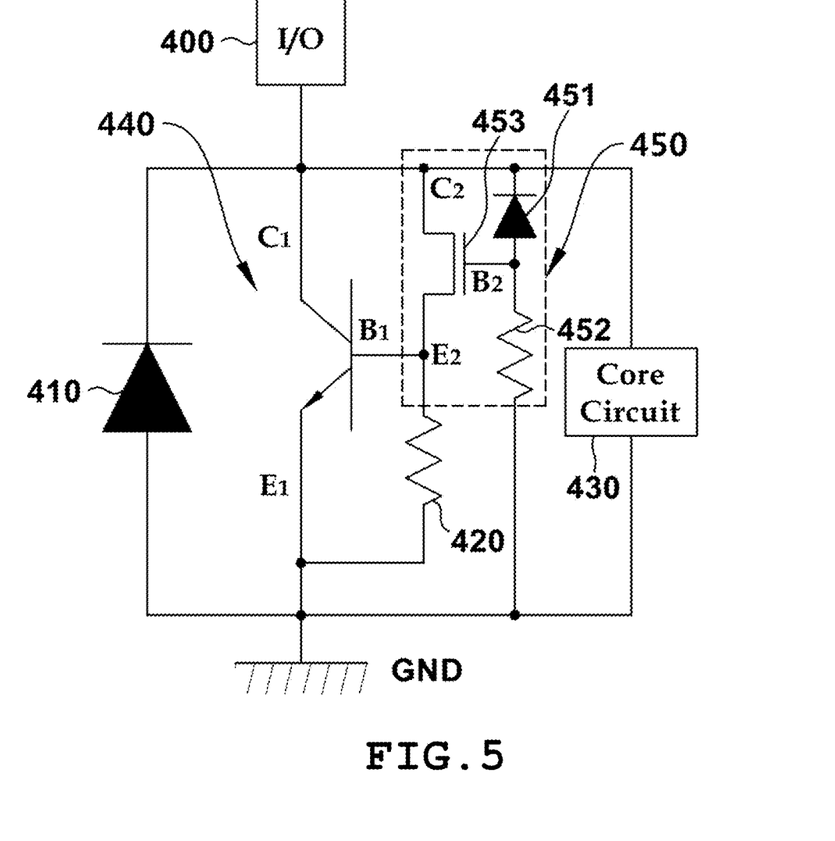
FIG. 5 is a cross-sectional view illustrating an example of an ESD protection circuit.

FIG. 5 is a circuit diagram illustrating an example of an ESD protection circuit that includes the ESD transistor shown in FIGS. 2 and 3.

Referring to FIG. 5, the ESD protection circuit is an ESD protection circuit combined with an ESD transistor 440 for high voltage that includes a collector, a base, and emitter electrodes C1, B1, and E1 at an I/O pad 400, in which the collector electrode C1 is combined with the I/O pad 400, the emitter electrode E1 is combined with a ground electrode GND, a resistor 420 is combined between the emitter electrode E1 and the base electrode B1, a diode 410 is combined between the emitter electrode E1 and the collector electrode C1, the resistor 420 and the diode 410 are connected in parallel, and a charge pump circuit 450 including a high-voltage FET 453 is combined between the collector electrode C1 and the base electrode B1.

In the charge pump circuit 450, a second diode 451 is formed between the collector electrode C2 and the base electrode B2 of the high-voltage FET 453 and a second resistor 452 is formed between the base B2 and the ground GND of the high-voltage FET 453.

As illustrated in FIG. 5, the charge pumping circuit 450 is added to the base electrode B1 of the ESD transistor 440 so that the high-voltage FET 453 rapidly operates in order for some of the charges to flow to the base electrode B1 of the ESD transistor 440 in inflow of ESD stress. Thus, the ESD transistor 440 may be turned on more quickly under ESD stress. This uses a gate couple effect and can be adjusted by the values of the second diode 451 formed between the collector electrode C2 and the base electrode B2 of the high-voltage FET 453 and the second resistor 452 formed between the base electrode B2 and the ground GND of the high-voltage FET 453.

As described above, in this example, a first resistor 420 is connected between the base electrode B1 and the emitter electrode E1 of the ESD transistor 440, together with the charge pumping circuit 450. The resistance value in this configuration may be 100 Ω~100 kΩ. The resistance of about 100Ω~1000Ω is useful, but higher resistance may be used in some cases. The resistance is for rapid increase in base potential due to current, which is generated when avalanche breakdown is generated between the base electrode B1 and the collector electrode C1 in inflow of ESD stress to the collector electrode C1. When the voltage of the base electrode B1 increases, the illustrated ESD transistor 440 may quickly respond to the ESD stress.

Further, the first diode 410 is grounded (GND) at the portion combined with the emitter electrode E1. A core circuit 430 connected in parallel with the ESD transistor 440 for high voltage is further included, and the first diode 410 is connected in parallel with the ESD transistor 440 for high voltage and the core circuit 430. The first diode 410 is connected in the opposite direction to the collector electrode C1. The ESD transistor 440 for high voltage may be a BJT.

According to one example, it is possible to provide more stable ESD protection circuit by providing the specific first diode 410 in parallel, together with the first resistor 420, outside the transistor. For example, because the diode 410 is disposed in parallel with the resistor 420 on the outside, more stable ESD transistor for high voltage can be provided.

The resistor 420 serves to adjust the potential between the base B and the emitter E. That is, it is possible to form an ideal ESD protection device by providing rapid turn-on voltage when positive stress is applied to the collector C, by more quickly increasing the potential of the base in inflow of stress.

The resistor 420 is connected between the base region 304 and the emitter region 307 in an example embodiment of the present disclosure, in which the resistance may be 100Ω~100 kΩ. The resistance of about 100Ω~1000 kΩ is useful, but higher resistance may be used in some cases. The function of the resistance is to rapidly increase the base potential due to current, which is generated when avalanche breakdown is generated between the base B and the collector C in inflow of the ESD stress to the collector C.

Figure 6:
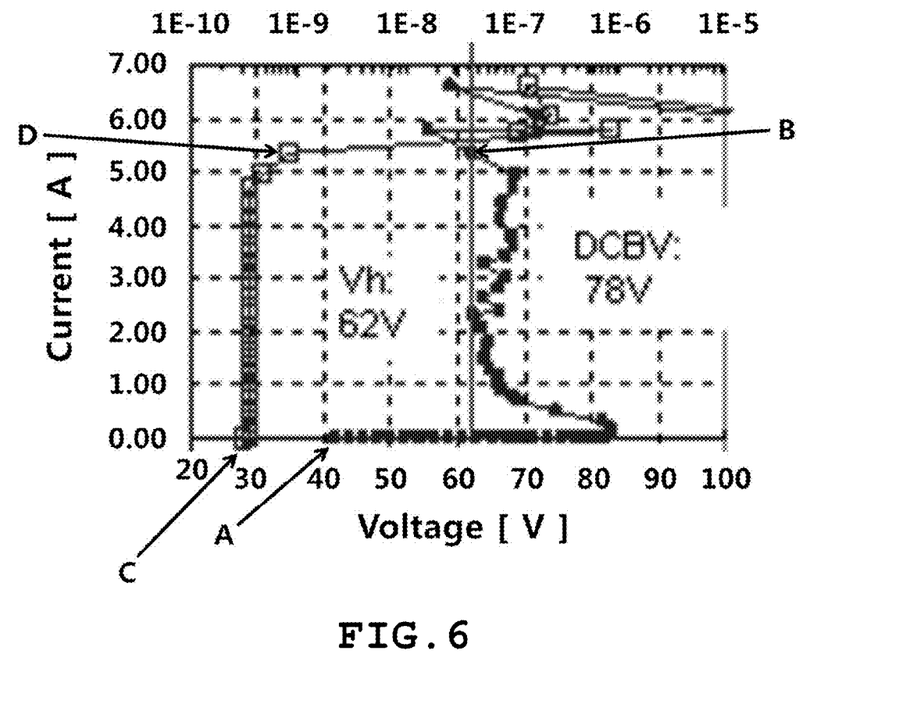
FIG. 6 is a graph illustrating an I-V curve that corresponds to a TLP stress pulse of an example of an ESD transistor for a high voltage device.

As the base voltage increases, the ESD BJT can be rapidly operated by the ESD stress. The performance of the ESD protection circuit, including the feature, was actually examined with a TLP device, and the result is illustrated in FIG. 6. Resistance can be generated by a poly resistor and an active resistor.

The diode 410 is provided for securing a stable BJT feature when stress is applied to the ground region GND, in which the stress in the ground region is allowed to move out to the I/O pad through the forward PN diode 410. In this configuration, the stress cannot move out through the ESD device, which is a BJT, such that an additional diode is needed.

According to one example, as illustrated in FIG. 5, when a BJT is formed by adding the first resistor 420 made of poly or metal at the outside, a stable BJT feature can be achieved when positive stress is applied to the collector C, as illustrated in FIG. 6. As illustrated, it can be seen that the holding voltage $V_h$ is 62V, which is at least 10% higher than the operation voltage $V_{op}$ of 50V of the high-voltage device in the core circuit. Therefore, even if the ESD device is turned on, the high-voltage devices in the core circuit can stably operate.

Two curves are shown. Right curve is a graph of voltage and current of an ESD device that reacted to an Input stress. For example, in FIG. 6, point A shows an ESD in which current of OA flows at a TLP stress 40V. Since current is very low, it is shown that the ESD device is not turned on yet. Point B shows a voltage of 62V and a current of 5.2 A in an ESD device that reacts to a TLP stress 100V. Since current of about 5.2 A flows, it is shown that many currents are applicable after an ESD device being turned-on. Left curve is a leakage current (Top X axis) for a reverse voltage (DC: e.g., 44V) to identify whether a DUT fails or not after stress forcing. That is, it is identified whether the ESD device is destroyed or not by the stress.

Left curve is a graph obtained by monitoring leakage in a manner of applying an input stress and a 40V TLP with a TLP pulse and then applying a DC voltage of 44V to a collector of an ESD device, when there lies 40V ESD device for example. In connection with above, in FIG. 6, point C is a graph of current measured by applying a DC voltage of 44V to a collector of an ESD device after 40V stress. The current is in a low leakage level as 0.3 nA, which indicates that the device is not destroyed yet. Point D shows current of 1 nA, which is measured by applying a DC voltage of 44V to a collector of an ESD device after a TLP stress 100V. There is a signal that the ESD device is deemed to receive some damage, due to an increase of leakage current rather than prior 0.3 nA. If this value becomes about 1 uA or 1 mA, it is judged that the device has received damage surely.

In the present invention, the holding voltage is high. That is, in the circuit having 60V operation, the device may be used stably only if the holding voltage is higher than 60V, at a TLP IV curve.

The resistor 420 serves to adjust the potential between the base B1 and the emitter E1. That is, it increases the potential of the base. Accordingly, it is possible to achieve a stable BJT feature, when positive stress is applied to the collector C1.

However, the BJT is turned on in the opposite direction in the order of the emitter E1, the base B1, and the collector C1, when negative stress is applied, such that a failure is easily generated at a low voltage level at thin bonding of the emitter E1.

Accordingly, because it is possible to reduce the ESD stress immunity level by individually using an external resistor, the specific first diode 410 is disposed in parallel with the external first resistor 420 in an example embodiment of the present invention, such that more stable ESD protection circuit can be provided.

In this configuration, the diode 410 is provided for securing a stable BJT feature when stress is applied to the ground region, in which the stress in the ground region is allowed to move out to the I/O pad through the forward PN diode 410. The stress cannot move out through the ESD device, which is a BJT, such that an additional diode is needed.

Therefore, as a diode is disposed in parallel with a resistor outside the ESD transistor for high voltage, as described above, it is possible to prevent deterioration of the diode while using the diode features.

FIG. 6 is a graph illustrating an I-V curve that reacts to a TLP stress pulse of an ESD transistor for high voltage.

The buried layer 310 is formed by highly doping with Sb or As and then growing silicon. This suppresses excessive diffusion of the buried layer 310.

The N-sink region 309 electrically connects the surface of the collector region 302 with the buried layer 310 by highly doping ($10^{18}$ atoms/cm$^3$ or more) with phosphorous which has relatively small atomic weight and then diffusing it through heat treatment.

The buried layer 310 is highly doped with N-type dopant ($10^{19}$ atoms/cm$^3$ or more) and then silicon is grown 2~20 μm deep in an epitaxial method, and the N+ collector region 302, which is an N+ active region connecting the collector electrode 303, and the buried layer 310 are electrically connected through NISNK ion implantation (highly doping $10^{19}$ atoms/cm$^3$ or more).

The base region (304, 318, 319) of the ESD BJT is formed deep, with a depth j–1 of 2~22 μm.

The N+ collector region 302 of the ESD BJT and the outermost P-substrate 320 are brought in contact with each other by adding a tap region 316 and the P-substrate 320 at the outermost side of the ESD BJT, thereby implementing a PN diode 410.

Further, the device is formed such that the resistance between the collector region 302 and the base region 304 of the ESD BJT is 100Ω~20 kΩ.

The area of the emitter region 308 is made at least 10 μm$^2$. For example, it is 50 μm$^2$ or more, so it can satisfy HBM 2 KV. Further, the length a–1 of the short side of the active region 302 of the collector should be at least 0.5 μm. So, one or more contact lines 316a can be formed. Accordingly, the appropriate length may be 2-3 μm. The length of the long side of the active region 302 should be 5~100 μm. The active region 302 may be another name of the collector region.

As in FIG. 5, in order to reduce the turn-on voltage of the ESD BJT 440 of the present invention, that is, for fast triggering, the source E2 in the circuit of the FET 453 is connected with the base B1 of the ESD BJT 440. It is a source in NMOS, and a drain in PMOS.

Although the ESD BJT (A) can perform the EST protection function by itself, in some cases, a specific circuit 450 (charge pumping circuit) may be added to further reduce the turn-on voltage. As shown in FIG. 5, by adding the circuit 450 to the base B1 of the ESD BJT, when ESD stress flows to the I/O pin 400 or the VDD pin 400, the high-voltage device 453 quickly operates so that some charges flow to the base B1 of the ESD BJT. Accordingly, faster ESD BJT turn-on can be induced under ESD stress. This uses the gate coupling effect and can be adjusted to the capacitance value of the resistor 452 and the diode 451 or the capacitor 451. Further, it is in close connection with the size of the high-voltage device 453.

The high-voltage device 453 is formed in the charge pumping circuit 450, in which the high-voltage device is a DMOS device such as nLDMOS or nEDMOS, the resistor 452 is connected in the GND direction to the gate B2 of the nLDMOS or nEDMOS, and the high-voltage diode 451 for forming a capacitor is connected in the collector direction of the ESD BJT 440.

In the configuration of the circuit 450 connected to the base B1 of the ESD BJT, the high-voltage device 453 that is an active device may be a PMOS instead of the NMOS. In this configuration, when it is not an ESD event (non-ESD event), the positions of the resistor 452 and the diode 451 become opposite in the circuit 450 of FIG. 5 to turn off the PMOS. That is, the resistor 452 is positioned between the gate of the PMOS and the collector of the ESD BJT and the diode or the capacitor is positioned between the gate of the PMOS and the GND.

According to FIG. 5, the core circuit is protected from ESD stress applied from the outside by positioning the BJT B1 between various I/O pads 400 and the ground GND line or the power-related VDD pin 400 and the GND line (or a pin for PAD). Further, when there is a device or a circuit that requires to be protected from ESD stress between specific pins, the collector C1 of the ESD BJT of the present invention is connected to the pin with higher potential and the emitter E1 of the ESD BJT of the present invention is connected to the pin with lower potential, thereby protecting the circuit.

In FIG. 5, a resistor (not shown) may be added between the collector C1 of the ESD device and the core circuit 430 that requires to be protected from ESD stress. On the other hand, a resistor (not shown) may not be provided at the portion, when the low impedance feature of the circuit is important.

According to the ESD transistor for high voltage and an ESD protection circuit thereof according to the present disclosure, it is possible to shunt the ESD current at a high level while reducing clamping voltage by forming a long current path in the high-voltage ESD transistor.

Further, it is possible to rapidly respond to ESD by performing partial count doping on the base contact region, and the possibility of latch-up is low and other core circuit features are not influenced.

Further, as a resistor and a diode are disposed in parallel outside the ESD transistor for high voltage, it is possible to prevent deterioration of the diode while using the diode features.

Further, it is possible to reduce the size ⅕~1/20 times smaller than the size of the existing high-voltage ESD diode.

The conditions (High thermal breakdown current (It2), Vh>Vop, low triggering voltage or turn-on voltage (Vt1) <$V_{breakdown}$ of Core TR) of the high-voltage ESD device can be satisfied, such that it is possible to effectively prevent a high-voltage product from ESD stress. ESD protection is difficult due to strong snapback in the existing LDMOS and EDMOS. The high-voltage device is an LDMOS or an EDMOS in most cases. When a GGNMOS that is an ESD protection device is an LDMOS or an EDMOS, the stress current immunity level per unit length is within 0.1~2 mA/μm in most cases. However, the stress immunity level per unit length is about 40 mA/μm, when the ESD device and structure described above are used. This means that the same area can support about 10-time higher stress level. Accordingly, it is possible to cope with the ESD test features with a smaller size, such that it is easy to reduce the size of the chip and contribute to improving reliability of the chip.

Further, a basically important factor for usability of the ESD is the holding voltage of the BJT. Most high-voltage devices are doped low at the drain area due to the individual features, such that strong snapback is generated and the holding voltage is low. Accordingly, the holding voltage of the ESD device should be higher than Vop-max, but it is difficult to be implemented by common methods. Therefore, the present invention provides a high-performance ESD device that basically satisfies the high-voltage ESD protection conditions.

The concept of the present invention can be applied to the technology using the BCD process, such that it can be used for all of high-voltage (20~100 V) products formed by the BCD process, as an effective ESD device that can protect high-voltage device and circuit. Further, since the ESD device has a performance at least 20 times higher than the existing diode clamps, it can contribute to reducing the size of a chip and chip reduction of up to 30% can be expected in products requiring high ESD specifications.

According to an example of the ESD transistor for high voltage described above, the ESD transistor may include: a substrate; a collector region on a surface of the substrate; a base region on the surface of the substrate; a base contact region in the base region; an emitter region spaced from the base contact region in the base region; a sink region vertically formed downward the collector region; and an buried layer (N-buried layer) formed to protrude horizontally further than the sink region under the sink region.

In the ESD transistor, the current that is applied to the collector region may flow in a U-shaped toward the emitter region through the base region after passing through the sink region formed vertically and the buried layer formed to protrude horizontally.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An ESD transistor, comprising:
   a collector region disposed on a surface of a substrate;
   a sink region disposed vertically below the collector region;
   a buried layer protruding horizontally further than the sink region under the sink region;
   an emitter region spaced apart from a base contact region in a base region; and
   a first insulating film disposed between the emitter region and the base contact region,
   wherein the ESD transistor is a bipolar junction transistor.

2. The ESD transistor of claim 1, wherein at least two collector regions, base contact regions, sink regions, and buried layers are respectively symmetrically disposed at both sides of the emitter region, and
   the at least two buried layers protrude toward the emitter region.

3. The ESD transistor of claim 1, wherein the sink region has an N-type dopant concentration in a range of $10^{19}$-$10^{21}$/cm$^3$.

4. The ESD transistor of claim 1, further comprising a collector expansion region disposed under the collector region.

5. The ESD transistor of claim 1, further comprising:
   a second insulating film disposed between the base contact region and the collector region.

6. The ESD transistor of claim 1, further comprising at least one additional base region surrounding the base region.

7. The ESD transistor of claim 1, further comprising a tap region spaced apart from the collector region by a third insulating film.

8. The ESD transistor of claim 7, further comprising an additional well region under the tap region.

9. The ESD transistor of claim 8, wherein an ESD diode is formed by another well region adjacent to the additional well region therebetween.

10. The ESD transistor of claim 1, further comprising a resistor connected between an emitter electrode disposed at the upper portion of the emitter region and a base electrode disposed at the upper portion of the base contact region.

11. The ESD transistor of claim 1, wherein the ESD transistor is configured such that current that is applied to the collector region flows in a U-shaped path toward the emitter region through the base region after passing through the sink region and the buried layer.

12. An ESD transistor, comprising:
   a collector region on a surface of a substrate;
   a base region on the surface of the substrate;
   a base contact region disposed in the base region;
   an emitter region spaced apart from the base contact region in the base region; and
   a sink region disposed vertically below the collector region and spaced apart from the base region by a well region disposed between the sink region and the base region,
   wherein the base region surrounds the emitter region and the base contact region.

13. An ESD protection circuit comprising an ESD transistor that comprises a collector electrode, a base electrode, and an emitter electrode,
   wherein the collector electrode is connected to an I/O pad;
   the emitter electrode is connected to a ground electrode;
   a first resistor is connected between the emitter electrode and the base electrode;
   a first diode is connected between the emitter electrode and the collector electrode; and
   a charge pump circuit comprising a high-voltage FET that is connected between the collector electrode and the base electrode.

14. The ESD protection circuit of claim 13, wherein the charge pump circuit comprises a second diode disposed between a collector electrode and a base electrode of the high-voltage FET, and
   a second resistor disposed between a base and a ground of the high-voltage FET.

15. The ESD protection circuit of claim 13, wherein the first diode is grounded at the portion combined with the emitter electrode.

16. The ESD protection circuit of claim 13, further comprising a core circuit connected in parallel with the ESD transistor,
   wherein the first diode is connected in parallel with the ESD transistor and the core circuit.

17. The ESD protection circuit of claim 14, wherein the first and second diodes are connected in opposite directions to the collector electrode.

18. The ESD protection circuit of claim 13, wherein the ESD transistor is a bipolar junction transistor.

19. The ESD transistor of claim 12, wherein the ESD transistor is a bipolar junction transistor.

20. The ESD transistor of claim 12, further comprising a buried layer disposed below the sink region and protruding horizontally into the well region further than the sink region toward the base region.

21. The ESD transistor of claim 1, wherein the base region is spaced apart from the sink region.

22. The ESD transistor of claim 1, wherein the base region is spaced apart from the buried layer.

23. The ESD transistor of claim 1, wherein the base region contacts a well region disposed between the sink region and the base region.

24. The ESD transistor of claim 1, wherein at least two buried layers are disposed below the base region and being spaced apart from each other.

25. The ESD transistor of claim 2, wherein the at least two buried layers are spaced apart from each other.

26. The ESD transistor of claim 12, further comprising a first buried layer and a second buried layer disposed below the base region, and wherein the first buried layer is spaced apart from the second buried layer.

27. The ESD transistor of claim 26, wherein at least two well regions are respectively symmetrically disposed at both sides of the emitter region, and the first buried layer contacts one of the at least two well regions, and the second buried layer contacts another of the at least two well regions.

* * * * *